(12) United States Patent
Murakami

(10) Patent No.: US 6,564,708 B2
(45) Date of Patent: May 20, 2003

(54) SCREEN PRINTING APPARATUS

(75) Inventor: Takehiko Murakami, Inagi (JP)

(73) Assignee: Minami Co., Ltd., Tokyo (JP)

(*) Notice: Subject to any disclaimer, the term of this patent is extended or adjusted under 35 U.S.C. 154(b) by 72 days.

(21) Appl. No.: 09/931,753

(22) Filed: Aug. 20, 2001

(65) Prior Publication Data

US 2003/0033943 A1 Feb. 20, 2003

(51) Int. Cl.$^7$ ............................................. B05C 17/04
(52) U.S. Cl. ................................... 101/123; 101/425
(58) Field of Search ................................. 101/114, 116, 101/123, 124, 129, 425; 118/213, 406

(56) References Cited

U.S. PATENT DOCUMENTS

| | | | | |
|---|---|---|---|---|
| 3,988,986 A | * | 11/1976 | Zimmer | 101/119 |
| 5,953,986 A | * | 9/1999 | Murakami | 101/123 |
| 5,965,220 A | * | 10/1999 | Schopping | 427/598 |
| 5,992,313 A | * | 11/1999 | Zimmer | 101/120 |

* cited by examiner

*Primary Examiner*—Ren Yan
(74) *Attorney, Agent, or Firm*—Nath & Associates PLLC; Harold L. Novick; Marvin C. Berkowitz

(57) ABSTRACT

To prevents a displacement of a screen mask accompanying with a movement of a squeegee and an oxidization of a printing agent, a printing agent sweeping drum (1) has closed both end portions, has a supporting shaft (2) inserted to a center portion thereof, has a lower end portion partly opened, is made rotatable with respect to the supporting shaft, oscillates along a moving direction of the squeegee via a movement of the supporting shaft (2), moves downward at a movement starting end position, moves upward at a terminal end position, and rotates at a predetermined angle in an opposite direction at a predetermined timing at the starting end position and the terminal end position, a squeegee (4) inclined at a predetermined angle and moving upward and downward at a predetermined timing being arranged within the printing agent sweeping drum 1, a squeegee (10) and a printing agent extruding plate (11) being attached to a lower end of the squeegee holder (4) and a nitrogen gas (17) being charged into the printing agent sweeping drum (1).

5 Claims, 5 Drawing Sheets

SCREEN PRINTING APPARATUS

BACKGROUND OF THE INVENTION

1. Field of the Invention

The present invention relates to a screen printing apparatus.

2. Description of the Conventional Art

A screen printing apparatus is structured such as to move a squeegee along an upper surface of a screen mask and transfer a printing agent such as a creamed solder mounted on the screen mask or the like to a plate to be printed such as a printed circuit board or the like through a through hole formed in the screen mask so as to print.

Further, the screen mask mentioned above is held within a frame in a state of being tensed by a holding member made of a raw material having a slight elasticity such as a Tetron or the like.

Furthermore, the conventional screen printing apparatus is structured such that two squeegees are employed and are alternately moved in opposite directions so as to print.

Accordingly, extrusive forces in opposite directions are repeatedly applied to the screen mask, and an elasticity of the holding member does not become uniform after a long time use. Then, as a result, the screen mask generates a displacement. Consequently, there occur matters that it is impossible to accurately print on the basis of a pattern of the printed circuit board corresponding to the plate to be printed, and that an application amount of the printing agent lacks in uniformity.

Moreover, there is generated a problem that in the case that the printing agent such as the creamed solder or the like is exposed to an air so as to be oxidized, the printing agent is solidified and hardly taken out from the through hole in the screen mask in addition that a quality thereof is deteriorated.

SUMMARY OF THE INVENTION

The present invention is made by taking the points mentioned above into consideration, and an object of the present invention is to provide a screen printing apparatus which can print by means of only movement in one direction of a single squeegee, can prevent an oxidization of a printing agent as much as possible, and can solve all of the problems mentioned above.

Accordingly, in accordance with a content of the present invention, there is provided a screen printing apparatus comprising:

a printing agent sweeping drum which has a supporting shaft inserted through a center portion, freely rotates around the supporting shaft, oscillates along a moving direction of a squeegee via a movement of the supporting shaft by a supporting apparatus, moves downward at a movement starting end position, moves upward at a terminal end position, rotates at a predetermined angle in an opposite direction at a predetermined timing at the starting end position and the terminal end position, and has a lower end portion partly opened;

a squeegee holder which is arranged so as to be inclined at a predetermined angle within the printing agent sweeping drum and moves upward and downward at a predetermined timing;

the squeegee attached to a lower end portion of the squeegee holder; and a printing agent extruding plate which is positioned at a front side in a forward moving direction of the squeegee.

Further, in the structure mentioned above, it is possible to close both end portions of the printing agent sweeping drum. With such an arrangement, it is possible to increase a sealing performance of the printing agent sweeping drum and it is possible to increase an oxidization preventing effect of the printing agent.

Further, in the case of closing both end portions of the printing agent sweeping drum so as to increase the sealing performance as mentioned above, the structure may be made such as to charge a nitrogen gas into the printing agent sweeping drum. In this case, it is possible to further improve the oxidization preventing effect of the printing agent. In particular, a significant effect can be obtained in the case that the printing agent is a tin or a copper.

Still further, in the structure mentioned above, it is possible to arrange a printing agent supplying apparatus within the printing agent sweeping drum. With such an arrangement, it is possible to quickly supply the printing agent within the sealed printing agent sweeping drum. Therefore, it is possible to further increase the oxidization preventing effect of the printing agent.

Moreover, the structures mentioned above may be combined so as to provide a screen printing apparatus comprising:

a printing agent sweeping drum which has a supporting shaft inserted through a center portion, freely rotates around the supporting shaft, oscillates along a moving direction of a squeegee via a movement of the supporting shaft by a supporting apparatus, moves downward at a movement starting end position, moves upward at a terminal end position, rotates at a predetermined angle in an opposite direction at a predetermined timing at the starting end position and the terminal end position, and has a lower end portion partly opened;

a squeegee holder which is arranged so as to be inclined at a predetermined angle within the printing agent sweeping drum and moves upward and downward at a predetermined timing;

the squeegee attached to a lower end portion of the squeegee holder;

a printing agent extruding plate which is positioned at a front side in a forward moving direction of the squeegee;

both end portions of the printing agent sweeping drum being closed;

a nitrogen gas being charged into the printing agent sweeping drum; and a printing agent supplying apparatus arranged within the printing agent sweeping drum, wherein a vertical plate with which a back surface of the squeegee is slidably in contact is mounted to a front surface of the printing agent supplying apparatus, a step portion for forming a gap by which one end of a lower end open portion of the printing agent sweeping drum enters between a back surface lower end portion of the plate and the screen mask is provided in the back surface lower end portion of the plate, the lower end open portion of the printing agent sweeping drum is made small, an end portion in a forward moving direction side of the squeegee in the lower end open portion is at a position surrounding a part of the printing agent existing between the squeegee and the printing agent extruding plate and on the other hand an end portion in an opposite side of the lower end open portion is at a position entering into the gap between the plate and the screen mask at a time of printing, and the end portion in one side of the lower end open portion is at a position being in contact with the plate and on the other hand the end portion in an opposite side is within the gap between the plate and the screen mask at a time of finishing the printing. Accordingly, a sealing performance of the printing agent sweeping drum is further improved, and it is possible to further improve the oxidization preventing effect by the nitrogen gas.

DESCRIPTION OF THE PREFERRED EMBODIMENTS

A description will be given of embodiments in accordance with the present invention with reference to the accompanying drawings.

Figure 1:
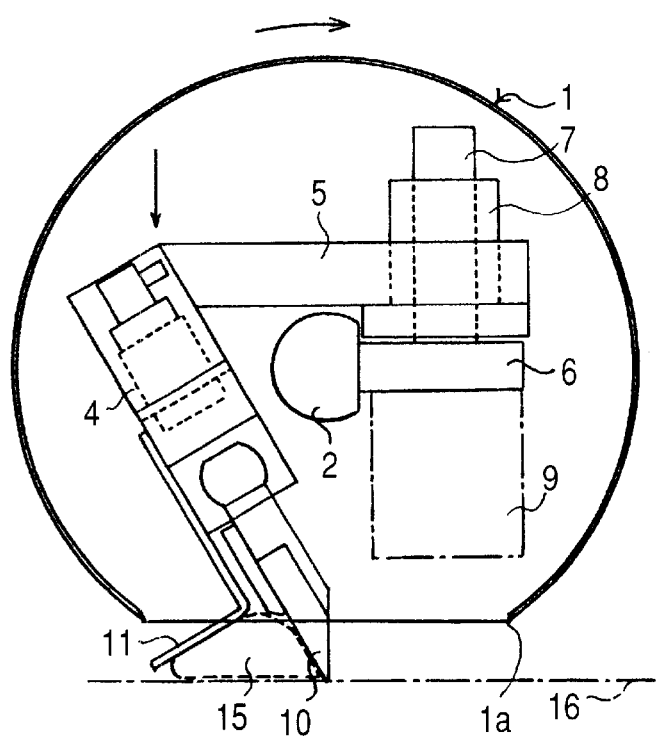
FIG. 1 is a side elevation view in a printing state of a main portion in accordance with a first embodiment of the present invention.
Figure 2:
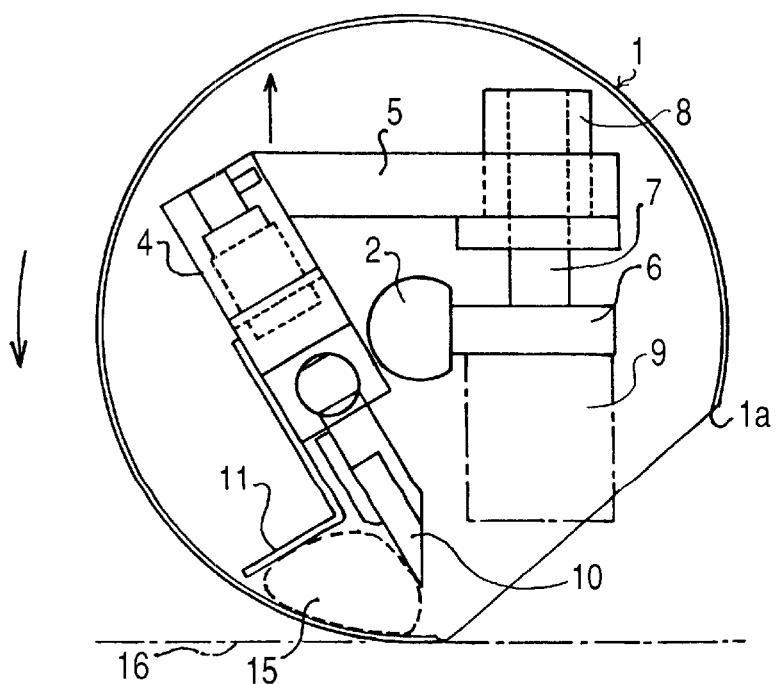
FIG. 2 is a side elevation view in a print finishing state of the main portion in accordance with the first embodiment of the present invention.
Figure 3:
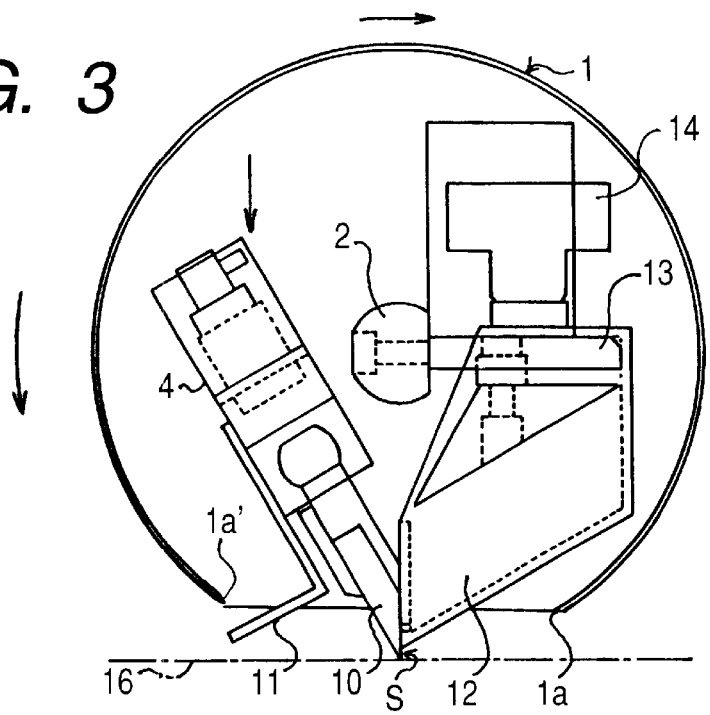
FIG. 3 is a schematic view at a time of supplying a printing agent of the main portion in accordance with the first embodiment of the present invention.
Figure 4:
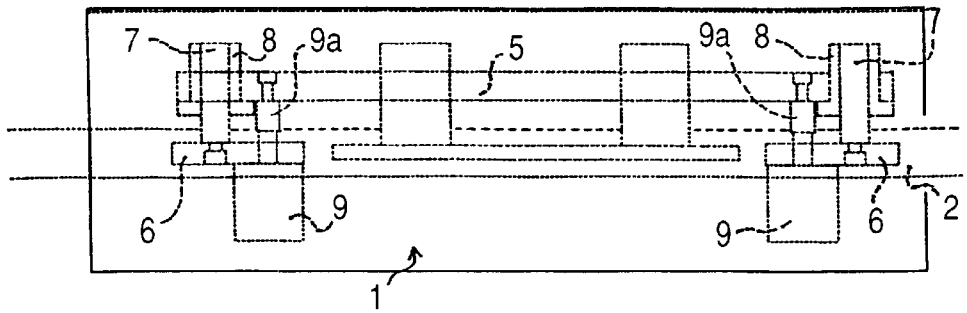
FIG. 4 is a front elevation view showing in a partly omitted manner of the main portion in accordance with the first embodiment of the present invention.
Figure 5:
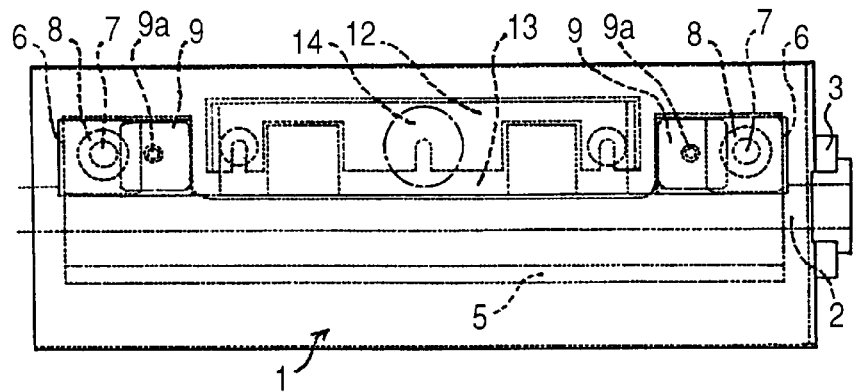
FIG. 5 is a plan view showing in a partly omitted manner of the main portion in accordance with the first embodiment of the present invention.

FIG. 1 is a side elevation view in a printing state of a main portion in accordance with a first embodiment of the present invention, FIG. 2 is a side elevation view in a print finishing state of the main portion, FIG. 3 is a schematic view at a time of supplying a printing agent of the main portion, FIG. 4 is a front elevation view showing in a partly omitted manner of the main portion, and FIG. 5 is a plan view showing in a partly omitted manner of the main portion in accordance with the first embodiment of the present invention.

In the drawings, reference numeral 1 denotes a printing agent sweeping drum in which a lower end portion is partly opened. In this case, reference numeral 1a denotes an open portion thereof. An end portion 1a' in a forward moving direction side of a squeegee mentioned below among the open portion 1a is formed in a blade shape so as to easily sweep. The printing agent sweeping drum 1 is closed at both end portions.

The printing agent sweeping drum 1 has a supporting shaft 2 inserted to a center portion thereof and is structured such as to freely rotate with respect to the supporting shaft 2. A gear 3 is mounted to an end portion in one side of the printing agent sweeping drum 1, and is engaged with a gear fixed to a rotary shaft in a reversible rotating motor mounted to a supporting apparatus (not shown).

The supporting shaft 2 is supported by the supporting apparatus (not shown) and is structured such as to be oscillated along a guide member (not shown) and be moved upward and downward at a suitable timing via a vertical moving apparatus such as a cylinder or the like.

The printing agent sweeping drum 1 oscillates along a moving direction of the squeegee via the movement of the supporting shaft 2 and is structured such as to move downward at a movement starting end position and move upward at a terminal end position. Further, the structure is made such as to rotate at a predetermined angle in an opposite direction at a predetermined timing via the driving operation of the reversible rotating motor at the starting end position and the terminal end position.

Reference numeral 4 denotes a squeegee holder which is arranged so as to be inclined at a predetermined angle within the printing agent sweeping drum 1 and move upward and downward at a predetermined timing.

Reference numeral 5 denotes a squeegee holder supporting plate. The squeegee holder supporting plate 5 is structured such that guide posts 7 and 7 are vertically stood from supporting plates 6 and 6 provided at positions with a suitable interval in an axial direction of the supporting shaft 2 in such a manner as to horizontally protrude, and guide sleeves 8 and 8 slidably fitted to the guide posts 7 and 7 are mounted to a part thereof, thereby freely moving upward and downward.

The squeegee holder supporting plate 5 is structured such as to be fixed to piston rods 9a and 9a of cylinders 9 and 9 vertically fixed to the respective supporting plates 6 and 6, thereby moving upward and downward at a suitable timing.

Reference numeral 10 denotes a squeegee attached to a lower end portion of the squeegee holder 4. A surface in an opposite side to a forward moving direction of the squeegee 10 is vertically cut.

Reference numeral 11 denotes a printing agent extruding plate attached to a front portion in the forward moving direction of the squeegee 10 in the lower end portion of the squeegee holder 4. The printing agent extruding plate 11 forms a right angle or a slightly smaller angle with respect to the squeegee 10.

Reference numeral 12 denotes a printing agent supplying apparatus arranged within the printing agent sweeping drum 1. The printing agent supplying apparatus 12 is positioned in an opposite side to the forward moving direction of the squeegee 10, and a front end surface thereof is made vertical, whereby a back surface of the squeegee 10 is slidably in contact therewith. Further, an interval S between the front end of the printing agent supplying apparatus and the screen mask is determined by taking into consideration of a thickness of the printing agent sweeping drum 1 and a warp of the front end of the squeegee 10 at a moving time, however, the interval S is set to 1 mm in the present embodiment.

Reference numeral 13 denotes a supporting plate of the printing agent supplying apparatus. The supporting plate 13 is provided so as to horizontally protrude to a position between the supporting plates 6 and 6 in the supporting shaft 2. Reference numeral 14 denotes a screw for connecting the supporting plate 13 and the printing agent supplying apparatus. Reference numeral 15 denotes a printing agent and reference numeral 16 denotes a screen mask.

Next, a description will be given of an operation of the present embodiment.

The printing agent sweeping drum 1 moves downward at the starting end position. Then, the squeegee 10 and the printing agent extruding plate 11 move downward so as to move out from the lower end open portion 1a of the printing agent sweeping drum 1, and synchronously with this, the printing agent sweeping drum 1 rotates so as not to prevent this operation. Accordingly, the squeegee 10 becomes in contact with the screen mask 16, and the printing agent 15 is mounted on a front portion in the forward moving direction of the squeegee.

In this state, as shown in FIG. 1, the squeegee 10 moves on the screen mask 16 while extruding the printing agent 15. Further, when the squeegee 10 reaches the movement terminal end position, the squeegee 10 and the printing agent extruding plate 11 move upward as shown in FIG. 2, and synchronously with this, the printing agent sweeping drum 1 rotates in a direction of sweeping the printing agent on the screen mask.

Consequently, the printing agent is held in a space among the printing agent sweeping drum 1, the squeegee 10, the printing agent extruding plate 11 and the front surface of the printing agent supplying apparatus 12 within the printing agent sweeping drum 1. Therefore, it is possible to reduce a contact of the printing agent with the air, and to prevent an oxidization as much as possible. Further, since the squeegee 10 moves only in one direction, extrusive force in an opposite direction as in the conventional art is not applied.

Next, in this state, the printing agent sweeping drum 1 moves upward and returns to the movement starting end position. The printing agent sweeping drum 1 again moves downward, and the operation at the starting end position is executed.

When an amount of the printing agent is reduced, the printing agent is supplied by the printing agent supplying apparatus 12. At this time, the squeegee 10 and the printing agent extruding plate 11 are slightly moved upward from the state shown in FIG. 3 and the printing agent is charged therebetween. In this case, a timing of supplying the printing agent may be set so that the printing agent is supplied at every predetermined number of movements of the squeegee by counting such a number, or may be set by detecting a residual quantity of the printing agent by means of a sensor, that is, the timing may be suitably determined.

Next, a description will be given of a second embodiment in accordance with the present invention with respect to FIGS. 6 to 8.

Figure 6:
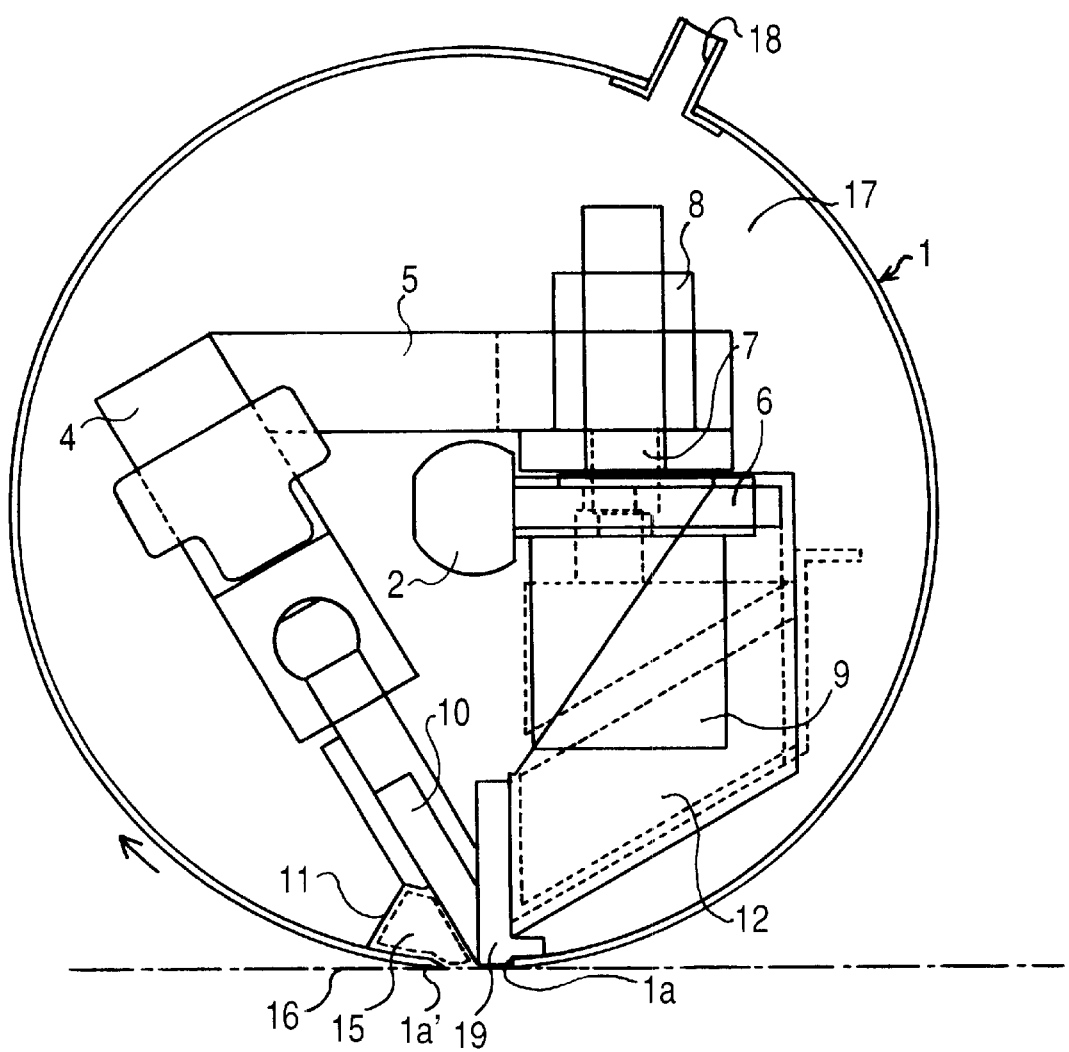
FIG. 6 is a side elevation view in a printing state of a main portion in accordance with a second embodiment of the present invention.
Figure 7:
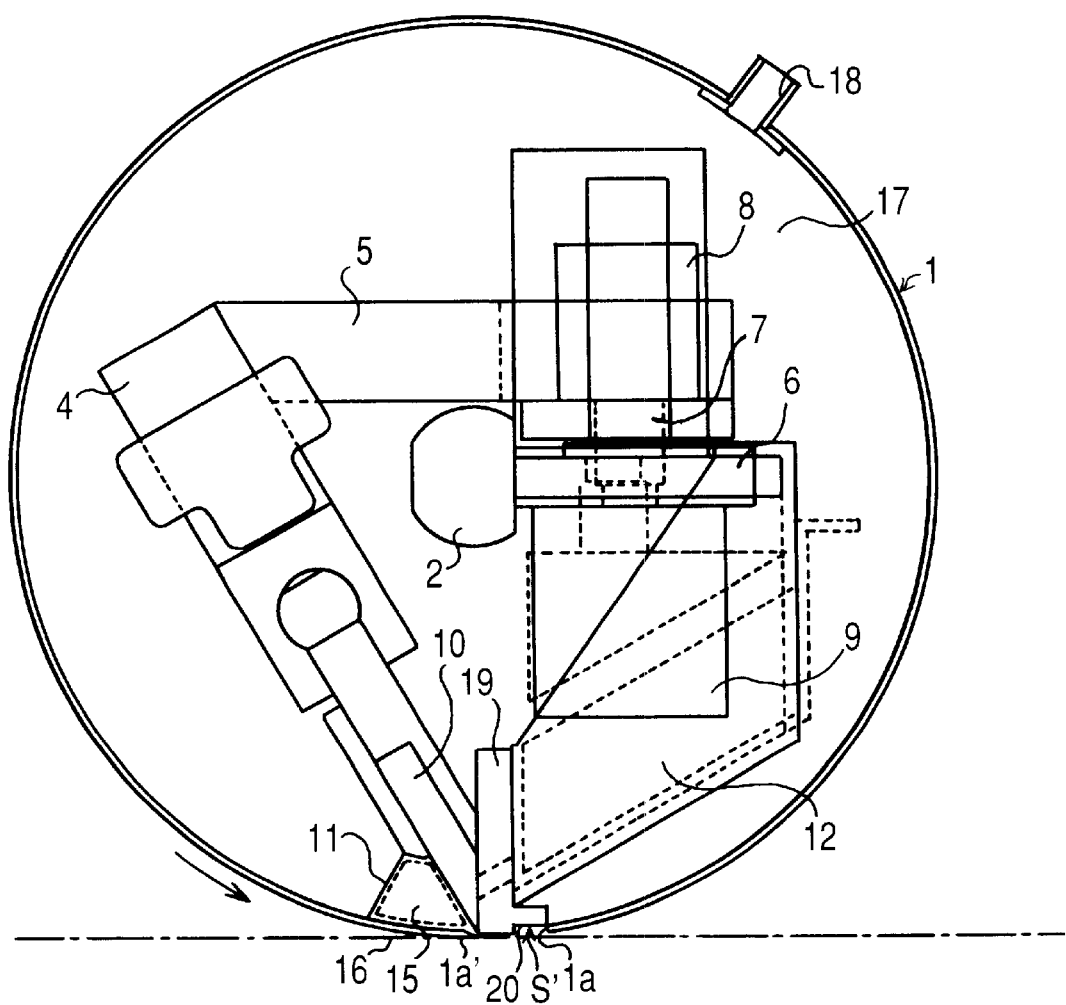
FIG. 7 is a side elevation view in a print finishing state of the main portion in accordance with the second embodiment of the present invention.
Figure 8:
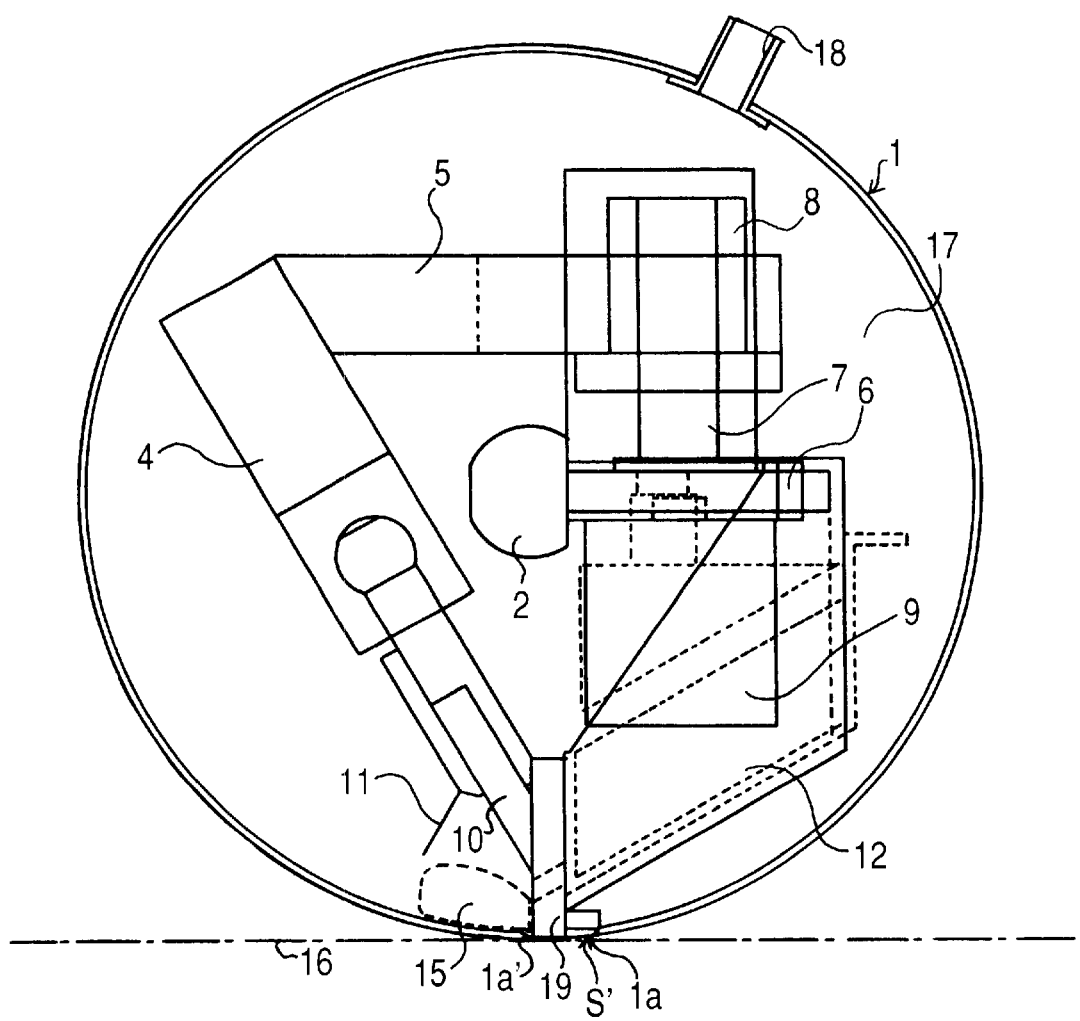
FIG. 8 is a side elevation view in a state that a squeegee holder moves upward after finishing the printing of the main portion in accordance with the second embodiment of the present invention.

FIG. 6 is a side elevation view in a printing state of a main portion, FIG. 7 is a side elevation view in a print finishing state of the main portion, and FIG. 8 is a side elevation view in a state that a squeegee holder moves upward after finishing the printing of the main portion.

A different point between the present embodiment and the first embodiment exists in a point that a nitrogen gas for preventing the printing agent from oxidizing is charged within the printing agent sweeping drum in the present embodiment. In this case, since the other structures and operations are the same as those of the first embodiment mentioned above, the same reference numerals are attached to the same elements and a detailed description will be omitted.

Further, in the present embodiment, an injection port 18 for charging a nitrogen gas 17 is provided on a peripheral surface of the printing agent sweeping drum 1.

A vertical plate 19 with which the back surface of the squeegee 10 is slidably in contact is mounted to the front surface of the printing agent supplying apparatus 12, and a step portion 20 for forming a gap S' by which one end of the lower end open portion 1a of the printing agent sweeping drum 1 enters between a back surface lower end portion of the plate 19 and the screen mask 16 is provided in the back surface lower end portion of the plate 19.

The lower end open portion 1a of the printing agent sweeping drum 1 is made as small as possible, and the structure is made such that at a time of printing, an end portion 1a' in a forward moving direction side of the squeegee of the lower end open portion 1a is at a position including a part of the printing agent 15 existing between the squeegee 10 and the printing agent extruding plate 11, and on the other hand an end portion in an opposite side of the lower end open portion 1a is at a position entering into the gap S' between the plate 19 and the screen mask 16. Further, the structure is made such that, at a time of finishing the printing, the end portion 1a' in one side is in contact with the plate 19 and the end portion in another side is within the gap S'. With such an arrangement, a sealing performance of the printing agent sweeping drum 1 is further improved.

Since the present invention has the structure and the operation is executed mentioned above and the printing operation only by the movement in one direction by the single squeegee, the extrusive force to the opposite direction as in the conventional art is not repeatedly applied to the screen mask. With such an arrangement, it is possible to prevent the displacement of the screen mask and the uneven application of the printing agent.

Further, it is simultaneously possible to prevent the printing agent from being oxidized as much as possible.

Still further, in the case of closing both end portions of the printing agent sweeping drum, it is possible to increase a sealing performance thereof and it is possible to increase an oxidization preventing effect of the printing agent.

Furthermore, in the case of closing both end portions of the printing agent sweeping drum so as to increase the sealing performance, when the structure is made such as to charge a nitrogen gas into the printing agent sweeping drum, it is possible to further improve the oxidization preventing effect of the printing agent. In particular, a significant effect can be obtained in the case that the printing agent is a tin or a copper.

Moreover, in the case of arranging a printing agent supplying apparatus within the printing agent sweeping drum, it is possible to quickly supply the printing agent within the sealed printing agent sweeping drum. Therefore, it is possible to further increase the oxidization preventing effect of the printing agent.

What is claimed is:

1. A screen printing apparatus comprising:

a printing agent sweeping drum which has a supporting shaft inserted through a center portion, freely rotates around the supporting shaft, oscillates along a moving direction of a squeegee via a movement of the supporting shaft by a supporting apparatus, moves downward at a movement starting end position, moves upward at a terminal end position, rotates at a predetermined angle in an opposite direction at a predetermined timing at the starting end position and the terminal end position, and has a lower end portion partly opened;

a squeegee holder which is arranged so as to be inclined at a predetermined angle within the printing agent sweeping drum and moves upward and downward at a predetermined timing;

the squeegee attached to a lower end portion of the squeegee holder; and a printing agent extruding plate which is positioned at a front side in a forward moving direction of the squeegee.

2. A screen printing apparatus as claimed in claim 1, wherein both end portions of the printing agent sweeping drum are closed.

3. A screen printing apparatus as claimed in claim 2, wherein a nitrogen gas is charged into the printing agent sweeping drum.

4. A screen printing apparatus as claimed in claim 1, wherein a printing agent supplying apparatus is arranged within the printing agent sweeping drum.

5. A screen printing apparatus comprising:

a printing agent sweeping drum which has a supporting shaft inserted through a center portion, freely rotates around the supporting shaft, oscillates along a moving direction of a squeegee via a movement of said supporting shaft by a supporting apparatus, moves downward at a movement starting end position, moves upward at a terminal end position, rotates at a predetermined angle in an opposite direction at a predetermined timing at the starting end position and the terminal end position, and has a lower end portion partly opened;

a squeegee holder which is arranged so as to be inclined at a predetermined angle within the printing agent sweeping drum and moves upward and downward at a predetermined timing;

the squeegee attached to a lower end portion of the squeegee holder;

a printing agent extruding plate which is positioned at a front side in a forward moving direction of the squeegee;

both ends of the printing agent sweeping drum being closed;

a nitrogen gas being charged into the printing agent sweeping drum; and a printing agent supplying apparatus arranged within the printing agent sweeping drum, wherein a vertical plate with which a back surface of the squeegee is slidably in contact is mounted to a front surface of the printing agent supplying apparatus, a step portion for forming a gap by which one end of a lower end portion of the printing agent sweeping drum enters between a back surface lower end portion of the plate and a screen mask is provided in the back surface lower end portion of the plate, the lower end open portion of the printing agent sweeping drum is made small, an end portion in a forward moving direction side of the squeegee in the lower end open portion is at a position surrounding a part of a printing agent existing between the squeegee and the printing agent extruding plate and on the other hand an end portion in an opposite side of the lower end open portion is at a position entering into the gap between the plate and the screen mask, at a time of printing, and the end portion in one side of the lower end open portion is at a position being in contact with the plate and on the other hand the end portion in an opposite side is within the gap between the plate and the screen mask at a time of finishing the printing.

* * * * *